United States Patent [19]

Ziegner

[11] Patent Number: 4,543,544
[45] Date of Patent: Sep. 24, 1985

[54] LCC CO-PLANAR LEAD FRAME SEMICONDUCTOR IC PACKAGE

[75] Inventor: Bernhard A. Ziegner, Westford, Mass.

[73] Assignee: Motorola, Inc., Schaumburg, Ill.

[21] Appl. No.: 568,157

[22] Filed: Jan. 4, 1984

[51] Int. Cl.⁴ ............................................. H01P 5/08
[52] U.S. Cl. ...................................... 333/34; 333/238
[58] Field of Search ............... 333/33, 34, 238, 246; 361/412, 414

[56] References Cited

U.S. PATENT DOCUMENTS

| 3,419,813 | 12/1968 | Kamnitsis | 333/34 X |
| 3,621,367 | 11/1971 | Rosen et al. | 333/238 X |
| 3,895,435 | 7/1975 | Turner et al. | 333/33 X |
| 4,047,132 | 9/1977 | Krajewski | 361/414 X |
| 4,186,358 | 1/1980 | Czech et al. | 333/33 |
| 4,460,880 | 7/1984 | Turner | 333/33 X |
| 4,479,100 | 10/1984 | Moghe et al. | 333/33 |

Primary Examiner—Paul Gensler
Attorney, Agent, or Firm—Raymond J. Warren

[57] ABSTRACT

An apparatus and method is disclosed for allowing faster and higher fidelity signals to be transmitted from a PC board to an IC by maintaining a constant impedance from the PC board to the IC. A leadless chip connector is used with a ground plane mounted co-planar to the conductor. As the conductor and ground planes extend toward the IC they decrease in width and the distance between the conductor and ground plane varies to maintain a constant impedance.

7 Claims, 8 Drawing Figures

LCC CO-PLANAR LEAD FRAME SEMICONDUCTOR IC PACKAGE

BACKGROUND OF THE INVENTION

1. Field of the Invention

This invention relates, in general, to a transmission device for connecting an integrated circuit (IC) to a printed circuit (PC) board, and more particularly, to an LCC co-planar lead frame semiconductor IC package of controlled impedance.

2. Description of the Background

Usually leads running between an IC and a PC board are a plain wire type. The conductor of a PC board is generally of a microstrip design, which is suitable for standard frequencies of up to 1-2 GHz. However, above 1-2 GHz the signals can become distorted, effectively limiting the speed with which an IC may be accessed and reducing the overall efficiency of the device using the IC. A leadless chip connector (LCC), while not requiring the wire leads discussed above, is not capable of solving the problem alone as it is unable to dissipate the power which can be created by the IC used at signal speeds in excess of 1-2 GHz. It has been a continuing problem in the field to develop a means of connecting an IC to a PC board in a manner allowing higher frequency signals to be used with higher fidelity.

SUMMARY OF THE INVENTION

Accordingly, it is an object of the present invention to provide a co-planar LCC for connecting to a PC board that will be suitable for operation above the 1-2 GHz range.

A further object of the present invention is to provide a lead frame package that will be suitable for operation above the 1-2 GHz range.

Still a further object of the present invention is to provide an improved dissipation capability for removing heat allowing an LCC co-planar lead frame IC package to operate at a higher ambient temperature.

Yet another object of the present invention is to improve the method of manufacturing and thus reduce the cost of packaging and mounting integrated circuits.

The above and other objects and advantages of the present invention are provided by an apparatus and method of maintaining a constant, or controlled, impedance along the transmission lines to the IC device.

A particular embodiment of the present invention comprises an apparatus and method for allowing faster and higher fidelity signals to be transmitted from a PC board to an IC. A conductor is used with the addition of ground planes co-planar to the conductor. The conductor and co-planar ground planes decrease in width as they extend from the PC board to the IC. As the conductor and co-planar ground planes reduce in width the distance between them is varied in a manner to maintain a controlled impedance throughout the transition. An LCC design is used to connect the present invention to a PC board. The LCC is designed to maintain a controlled impedance between the PC board and the co-planar transmission line.

The present invention, by maintaining a relatively constant, controlled impedance from the PC board to the IC, allows a higher frequency signal to be transmitted with higher fidelity.

BRIEF DISCUSSION OF THE DRAWINGS

DETAILED DESCRIPTION OF THE INVENTION

Figure 1:
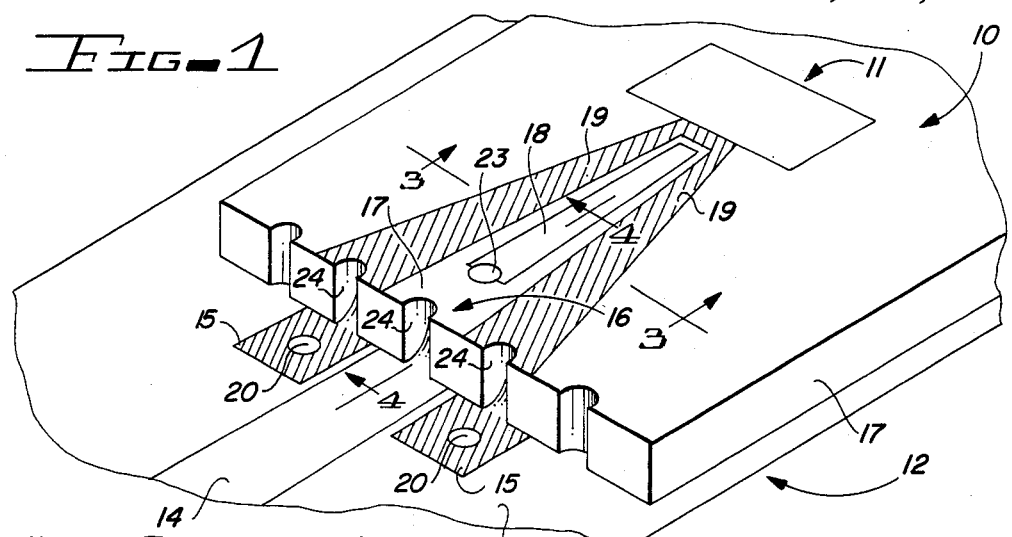
FIG. 1 is a perspective view of an LCC co-planar transmission device embodying the present invention connecting an IC to a PC board.
Figure 4A:
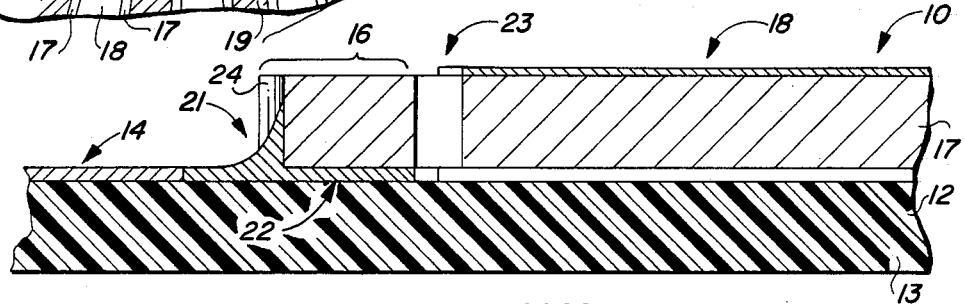
FIG. 4A is an enlarged cross-sectional view as seen from the line 4—4 of FIG. 1 of the LCC co-planar transmission device embodying the present invention as it connects to the PC board.

Referring to the diagram of FIG. 1 an LCC coplanar transmission package, generally designated 10, embodying the present invention is illustrated. LCC package 10 is shown as it interacts with an integrated circuit (IC) 11 and a printed circuit (PC) board 12. PC board 12 is illustrated as a standard microstrip transmission line, which may consist of a dielectric substrate 13, a conductor 14 running above the surface of dielectric substrate 13, a ground plane 15, a hole 20 having a conductive wall, and a ground plane (not shown) running along the opposite surface of dielectric substrate 13. Ground plane 15 is coupled to the ground plane on the opposite surface of substrate 13 by the conductive wall of hole 20. While this diagram illustrates one particular type of PC board it should be noted that many others exist and may be used with the present invention. LCC package 10 consists of an impedance matching area 16, a dielectric substrate 17, an indentation 24 having a conductive wall, and an opening 23 disposed through substrate 17. Opening 23 has a conductive wall which provides the connection between a coplanar conductor 18 and conductor 14 as will be shown in more detail in FIG. 4A. This area maintains a constant impedance between PC board 12 and LCC package 10. A schematic example of this is illustrated in FIG. 4A. Coplanar conductor 18 is located on dielectric substrate 17. To either side of coplanar conductor 18 is a coplanar ground plane 19 separated from coplanar conductor 18 by dielectric 17. As coplanar conductor 18 and coplanar ground planes 19 approach IC 11 they narrow in width to allow the connection of a number of conducting lines to IC 11. As the coplanar conductor 18 tapers the distance between it and the coplanar ground planes 19 varies to maintain a constant impedance.

Figure 2:
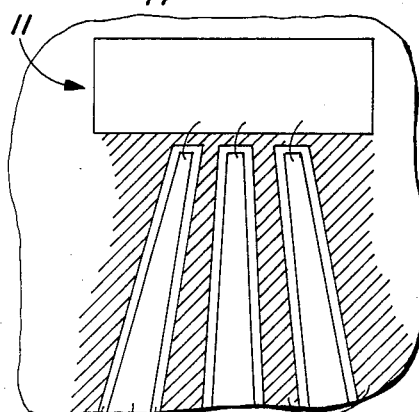
FIG. 2 is a plane view of an LCC co-planar transmission device embodying the present invention connected to an IC.

Referring now to FIG. 2, a plane view of an LCC coplanar transmission device embodying the present invention is illustrated coupled to IC 11. A plurality of coplanar conductors 18 are coupled to IC 11. Surrounding each coplanar conductor 18 is dielectric 17 and between dielectrics 17 is a coplanar ground plane 19. As illustrated, the coplanar conductor 18 and coplanar ground plane 19 narrow in width as they approach IC 11 to allow room for the number of connections required. The width of dielectric 17, or distance between conductor 18 and ground planes 19, also varies as the coplanar lines taper so as to maintain a relatively constant, or controlled, impedance along the length of the coplanar conductor 18.

Figure 3:
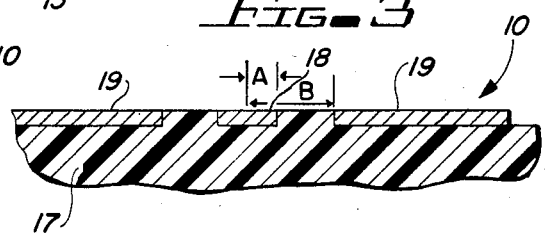
FIG. 3 is an enlarged cross-sectional view along a portion of line 3—3 of FIG. 1 of the co-planar transmission area of the LCC co-planar transmission device embodying the present invention.

Referring now to FIG. 3 an enlarged cross-sectional area is shown along a portion of line 3—3 of FIG. 1. Dielectric substrate 17 is illustrated with coplanar conductor 18 and coplanar ground planes 19 formed on a surface thereof.

The impedance of coplanar conductor 18 is primarily a function of spacing between coplanar conductor 18 and coplanar ground planes 19 (B-A). The dimensions of coplanar conductor 18 and coplanar ground planes 19 are often determined by the manufacturer's capability or the application desired. It is preferred that the width of coplanar conductor 18 and coplanar ground planes 19 be four to ten times that of the width of the dielectric 17 (B-A), but this is not a requirement. The impedance, $Z_0$, of coplanar conductor 18 is defined by the equation $$Z_0 = \frac{1}{C_p V_{ph}} \quad (1)$$

Where $C_p$ is the capacitance per unit length and $V_{ph}$ is the phase velocity of the signal. If dielectric 17 is of uniform dielectric constant ($\epsilon_r$) then the capacitance per unit length, $C_p$, of the signal is, $$C_p = (\epsilon_r + 1)\epsilon_o \left(\frac{2A}{B}\right) \quad (2)$$

Where $\epsilon_0$ (8.54 times $10^{-12}$ farads per meter) is the permittivity constant of free space. Taking $\epsilon_r=4$, the capacitance would then be $8.54 \times 10^{-11} \times (A/B)$ farads per meter where A is one-half the width of the coplanar conductor 18 and B is A plus the distance between coplanar conductor 18 and coplanar ground plane 19, FIG. 3. The phase velocity, $V_{ph}$, of the signal can be estimated at, $$V_{ph} = \left[\frac{2}{\epsilon_r + 1}\right]^{\frac{1}{2}} C \quad (3)$$

Where C is a constant, $3 \times 10^8$ meters per second. Taking $\epsilon_r=4$, the phase velocity would then be $1.9 \times 10^8$ meters per second. Substituting equations 2 and 3 into equation 1 gives, $$Z_0 = \left(\frac{B}{A}\right)\left(\frac{1}{2\epsilon_o C \sqrt{\epsilon_r + 1} \sqrt{2}}\right) \quad (4)$$

which shows that the impedance is a function of the distance between coplanar conductor 18 and coplanar ground plane 19. In this example the impedance would be $Z_0=59.9$ (B/A). As A decreases in width, out of necessity as it approaches IC 11, B, the distance from the center of coplanar conductor 18 to the cage of coplanar ground plane 19, must also decrease.

In practical application the width, 2A, of coplanar conductor 18 is predetermined by the physical dimensions of the chip carrier and the number of conductors. The impedance, $Z_0$, may then be selected taking a number of factors into consideration. These factors include such things as: matching the impedance of the other conductors; and the maximum and minimum impedances given the overall area. Once these variables are selected the distance B may be determined by the equation:

$$B = (Z_0)(A)2\epsilon_o C \sqrt{\epsilon_r + 1} \sqrt{2} \quad (5)$$

Assigning the variable, X, to represent the distance between coplanar conductor 18 and coplanar ground plane 19, then $B=X+A$. Substituting this into equation (5) and solving for X provides the equation:

$$X = A[Z_0(2\epsilon_o C \sqrt{\epsilon_r + 1} \sqrt{2}) - 1] \quad (6)$$

By maintaining a controlled impedance and by adding coplanar ground planes, signal frequencies above the 1-2 GHz range may be used with increased fidelity.

This describes the function of one preferred embodiment, others include; having dielectric substrates above and below conductor 18 and coplanar ground planes 19; having a ground plane below the dielectric substrate; and having a ground plane above and below a dielectric substrate with conductor 18 and coplanar ground plane 19 between.

Figure 4B:
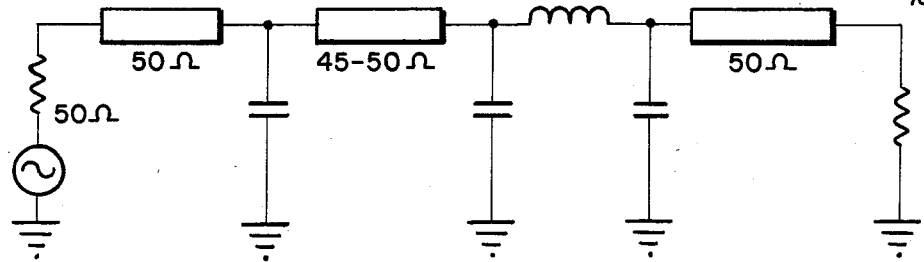
FIG. 4B is a schematic diagram of the impedances shown in FIG. 4A.

Referring now to FIG. 4A an enlarged cross-sectional view as seen from the line 4—4 of FIG. 1. is illustrated. FIG. 4A shows an LCC coplanar transmission device embodying the present invention as it couples to PC board 12. Spaced above PC board 12 is LCC package 10, which is coupled at welds, or connectors, 21. Here a signal travels along the microstrip conductor 14 to weld 21 and impedance matching area 16. The impedance matching area consists of a conductor 22 and connecting opening 23. Weld 21 serves two purposes: first, weld 21 couples LCC 10 to PC 12; and second, weld 21 provides electrical contact from conductor 14 to line 18 via conductive opening 23. This impedance matching area is used to maintain a constant, or controlled, impedance between LCC 10 and PC board 12. Conductor 22 is a specific line impedance as illustrated in the schematic diagram, FIG. 4B. The distance from the edge of LCC 10 to connecting opening 23 is one of manufacturer's preference and is not determinitive of the impedance for this area. The diameter of connecting opening 23 should be as large as practical so as to reduce its inherent inductance value. As a result, by controlling the impedance of conductor 22 and inductance of connecting opening 23 a constant impedance between PC board 12 and LCC 10 can be maintained.

Through keeping a constant, or controlled, impedance from PC board 12 through LCC coplanar conductor 10 to IC 11 higher frequency signals, above 1-2 GHZ, may be used with much improved fidelity. The use of higher frequency signals means faster transmission of the signals and an improved efficiency in the chip. This in turn improves the efficiency of the overall device the chip is used in.

Figure 5:
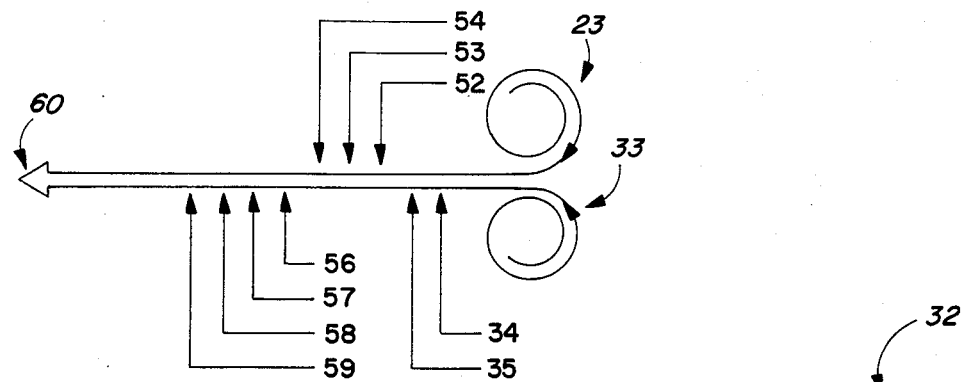
FIG. 5 is a general assembly flow diagram for the assembly of LCC co-planar transmission devices.
Figure 6:
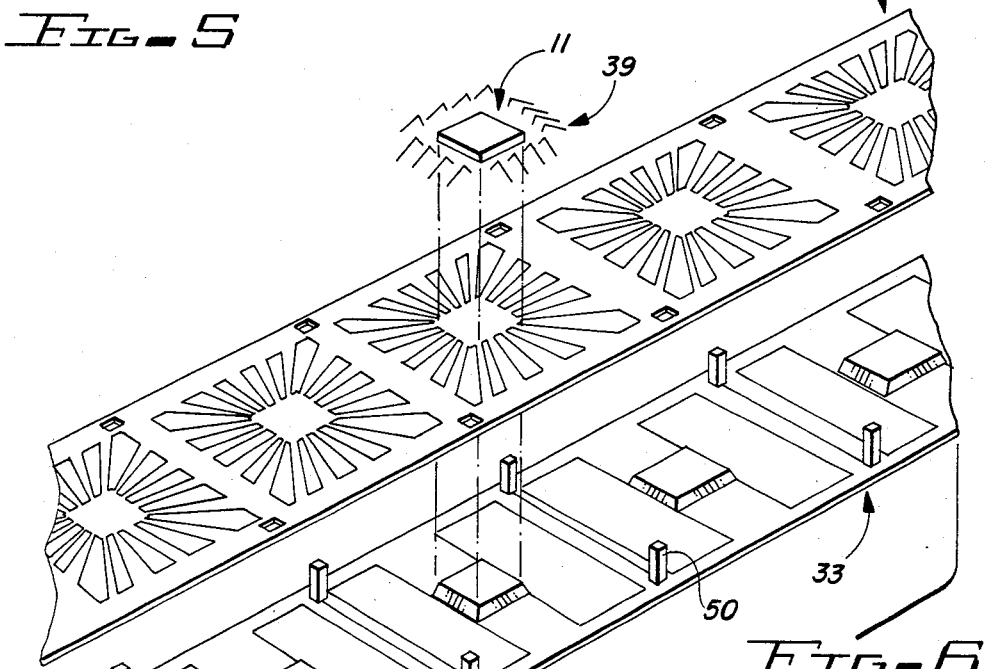
FIG. 6 is a detailed assembly flow diagram for the assembly of LCC co-planar transmission devices.

Referring now to FIG. 5 a general assembly flow diagram for the assembly of LCC coplanar transmission devices, embodying the present invention, is illustrated. A role of coplanar lead frames 32 is processed through an assembly line. Simultaneously a role of base frames 33 is unrolled parallel to coplanar lead frame 32 and connected to coplanar lead frame 32 at a work station 34 where base tabs 50, FIG. 6, are welded. At work station 35 a heat sink pad is connected and the heat sink 36, FIG. 6, is then brazed to this assembly. At work station 52 the frames are cut and loaded into a magazine where they are die and wire bonded at work stations 53 and 54, respectively. These are then coated, injection molded, separated and tested at work stations 56, 57, 58 and 59, respectively. These then proceed to work station 60 where the magazine is unloaded. A more detailed illustration of the assembly is shown in FIG. 6. IC 11 could be coupled to the coplanar lead frame 32 without heat sink 36, however, due to the significant amount of power dissipated by certain IC's such as very high speed IC's (VHSIC), a means of forming an inexpensive lead frame with a heat sink is required.

In FIG. 6 lead frame 32 and base frame 33 are illustrated as they come off of the rolls, FIG. 5. IC 11 is shown above lead frame 32 where it will be connected using leads 39 and heat sink 36 is shown below base frame 33 where it will be connected.

Figure 7:
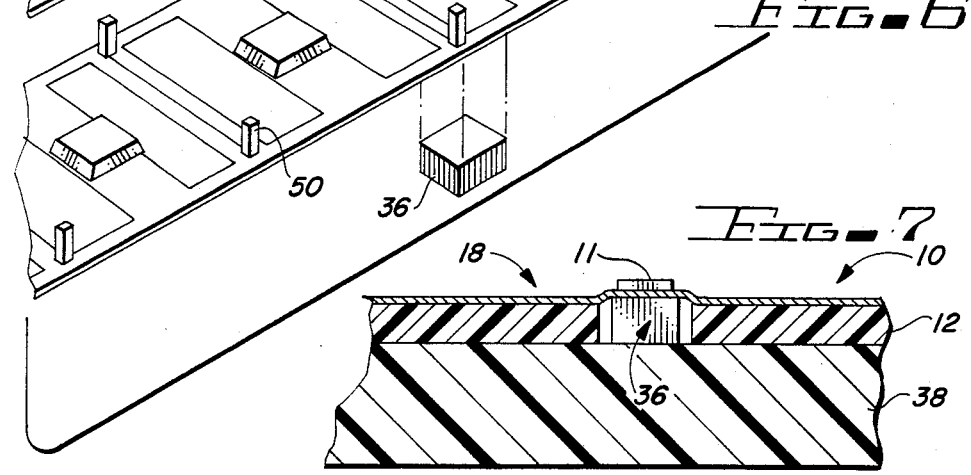
FIG. 7 is a cross-section of an LCC coplanar transmission device embodying the present invention.

In FIG. 7 a cross-section of an LCC coplanar transmission device 10 embodying the present invention is illustrated. LCC 10 is connected to IC 11 on the top and PC board 12, which has a chassis 38 on the bottom. LCC 10 is also coupled to chassis 38, through heat sink 36. Without the use of heat sink 36 the coplanar leads would not find application with higher dissipation requirements. This type of package, with heat sink 36, would allow high power devices to be packaged in the coplanar method.

This package provides a method of connecting an IC to a PC board that requires less time, as opposed to making individual connections, and would be more cost efficient.

Thus, it is apparent that there has been provided, in accordance with the invention, a device and method that fully satisfies the objects, aims, and advantages set forth above.

It has been shown that the present invention is suitable for operating above the 1–2 GHz range.

It has been shown further, that the present invention has improved dissipation capabilities for removing heat allowing the apparatus to operate at a higher ambient temperature.

It has also been shown that the present invention allows for an improved method of manufacturing resulting in a reduced cost.

While the invention has been described in conjunction with specific embodiments thereof, it is evident that many alterations, modifications, and variations will be apparent to those skilled the art in light of the foregoing description. Accordingly, it is intended to embrace all such alternatives, modifications, and variations as fall within the spirit and broad scope of the appended claims.

I claim:

1. A transmission device for coupling an IC device to a PC board comprising:
   a first controlled impedance means for controlling the impedance from said PC board, said first controlled impedance means being coupled to said PC board;
   a tapered conductor having a first end and a second end, said first end being wider than said second end, said first end of said tapered conductor being coupled to said first controlled impedance means and said second end being coupled to said IC device; and
   a tapered co-planar ground plane being juxtaposed to said tapered conductor, said tapered co-planar ground plane having a first end and a second end said first end being wider than said second end, said first end of said tapered co-planar ground plane being juxtaposed to said first end of said tapered conductor and said second end of said tapered co-planar ground plane being juxtaposed to said second end of said tapered conductor.

2. The transmission device of claim 1 wherein said first controlled impedance means comprises;
   a first conductor of predetermined impedance coupled to a conductor of said PC board;
   a first substrate defining an opening therethrough; and
   a second conductor disposed on a wall of the opening of the substrate, said second conductor having a predetermined inductance and said second conductor coupling said first conductor to said second controlled impedance of said transmission device.

3. The transmission device of claim 2 wherein an impedance, $Z_0$, of said tapered conductor is determined by $$\left(\frac{B}{A}\right)\left(\frac{1}{2\epsilon_o C \sqrt{\epsilon_r + 1} \sqrt{2}}\right)$$

where $\epsilon_0$ is a constant permittivity of free space, C is a velocity of a signal being transmitted through said transmission device, $\epsilon_r$ is a permittivity constant of said first substrate, A is one-half of the width of said tapered conductor and B is the distance between said tapered conductor and said tapered coplanar ground plane plus A.

4. A method of transmitting a signal from a PC board to an IC device through an LCC co-planar transmission device comprising the steps of:
   transmitting said signal from said PC board to an impedance matching substrate, said impedance matching substrate defining an opening therethrough;
   transmitting said signal along a conductive wall of the opening of said impedance matching substrate; and
   transmitting said signal along a tapered conductor from said controlled impedance means to said IC device, said tapered conductor juxtaposed to a tapered co-planar ground plane forming a controlled impedance substantially through the length thereof.

5. A transmission device for coupling an IC device to a PC board comprising:
   a first conductor of predetermined impedance coupled to a conductor of said PC board;
   a first substrate having a first surface, a second surface, and an opening disposed therethrough;
   a second conductor disposed on a wall of the opening of said first substrate, said second conductor having a first end and second end, said first end being coupled to said first conductor, said second conductor also having a predetermined inductance and said second conductor reacting with said first conductor to maintain a controlled impedance with said PC board;
   a tapered conductor coupling said second end of said second conductor to said IC device, said tapered conductor being disposed on said first surface of said first substrate; and a coplanar ground plane being juxtaposed to said third conductor, said co-planar ground plane being disposed on said first surface of said first substrate and said co-planar ground plane reacting with said tapered conductor to maintain a controlled impedance from said second conductor to said IC device.

6. The transmission device of claim 5 wherein said tapered conductor comprises a first end, a second end, a first edge and a second edge, said first end being wider than said second end, said first end of said tapered conductor being coupled to said second conductor, said second end of said tapered conductor being coupled to said IC device.

7. The transmission device of claim 6 wherein said co-planar ground plane comprises a first edge and a second edge, said first edge of said co-planar ground plane being disposed a variable distance X from said second edge of said tapered conductor, X being defined by $$A[Z_0(2\epsilon_o C \sqrt{\epsilon_r + 1} \sqrt{2}) - 1]$$

Where A is one-half the width of the tapered conductor, $Z_0$ is the impedance desired, $\epsilon_0$ is a constant permittivity of free space, C is a velocity of a signal being transmitted through said tapered conductor, and $\epsilon_r$ is a permittivity constant of said second substrate.

* * * * *